United States Patent
Ersek

(10) Patent No.: US 10,581,354 B2
(45) Date of Patent: Mar. 3, 2020

(54) METHOD FOR DETECTING A FAULT IN A GENERATOR UNIT

(71) Applicant: Robert Bosch GmbH, Stuttgart (DE)

(72) Inventor: Zoltan Ersek, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 29 days.

(21) Appl. No.: 15/772,590

(22) PCT Filed: Oct. 28, 2016

(86) PCT No.: PCT/EP2016/076044
§ 371 (c)(1),
(2) Date: May 1, 2018

(87) PCT Pub. No.: WO2017/084863
PCT Pub. Date: May 26, 2017

(65) Prior Publication Data
US 2019/0097557 A1    Mar. 28, 2019

(30) Foreign Application Priority Data
Nov. 18, 2015 (DE) .......... 10 2015 222 773

(51) Int. Cl.
*H02P 9/00* (2006.01)
*H02P 29/02* (2016.01)
*H02P 9/48* (2006.01)
*G01R 31/00* (2006.01)
*G01R 31/34* (2006.01)

(52) U.S. Cl.
CPC ......... *H02P 9/006* (2013.01); *G01R 31/006* (2013.01); *G01R 31/343* (2013.01); *H02P 9/48* (2013.01); *H02P 29/02* (2013.01)

(58) Field of Classification Search
USPC ................... 322/24, 27, 28, 34; 361/20
See application file for complete search history.

(56) References Cited

U.S. PATENT DOCUMENTS 3,534,228 A * 10/1970 Hyvarinen ............. H02H 7/065
                                                                361/20
5,168,416 A * 12/1992 Bailey ................... B60L 3/0061
                                                                361/31

(Continued)

FOREIGN PATENT DOCUMENTS

DE    102015211933 A1    12/2016
FR    2918516 A1    1/2009
WO    9609674 A1    3/1996

OTHER PUBLICATIONS

International Search Report dated Sep. 9, 2017, of the corresponding International Application PCT/EP2016/076044 filed Oct. 28, 2016.

*Primary Examiner* — Pedro J Cuevas
(74) *Attorney, Agent, or Firm* — Norton Rose Fulbright US LLP; Gerard Messina

(57) ABSTRACT

A method for detecting a fault in a generator unit that has an electrical machine including a rotor winding and a stator winding and a rectifier connected thereto, via which the electrical machine is connected to an electrical system of a motor vehicle. Whether or not the fault exists is determined as a function of an excitation current traversing the rotor winding of the electrical machine and as a function of a setpoint value of the excitation current.

11 Claims, 13 Drawing Sheets

(56) References Cited

U.S. PATENT DOCUMENTS

| | | | | |
|---|---|---|---|---|
| 5,245,495 A * | 9/1993 | Bailey | | B60L 3/0023 361/23 |
| 5,453,901 A | 9/1995 | Lackey | | |
| 5,528,444 A * | 6/1996 | Cooke | | B60L 3/003 361/20 |
| 5,528,445 A * | 6/1996 | Cooke | | B60L 3/003 361/20 |
| 5,892,342 A * | 4/1999 | Friedlander | | B60L 3/0023 318/139 |
| 6,222,349 B1 * | 4/2001 | LeRow | | H02J 7/1453 322/33 |
| 6,534,959 B1 * | 3/2003 | Anderson | | H02J 7/166 322/27 |
| 6,903,556 B2 * | 6/2005 | Sutton | | G01R 31/343 324/230 |
| 7,741,792 B2 * | 6/2010 | Fujishiro | | B60L 15/025 318/34 |
| 8,049,458 B2 * | 11/2011 | Seguchi | | H02P 8/12 318/432 |
| 8,164,312 B1 * | 4/2012 | Eitzmann | | H02P 9/105 322/37 |
| 8,378,644 B2 * | 2/2013 | Said | | H02P 9/302 322/44 |
| 8,896,261 B2 * | 11/2014 | Bando | | H02P 9/007 290/44 |
| 9,211,795 B2 * | 12/2015 | Kimoto | | B60L 53/55 |
| 9,337,686 B2 * | 5/2016 | Tunzini | | H02P 29/032 |
| 9,397,601 B2 * | 7/2016 | Terada | | H02P 9/08 |
| 9,431,946 B2 * | 8/2016 | Katsumata | | H02P 21/141 |
| 9,841,467 B2 * | 12/2017 | DeMarco | | G01R 31/343 |
| 9,859,738 B2 * | 1/2018 | Katayama | | H02J 7/0077 |
| 9,991,832 B2 * | 6/2018 | Graefling | | H02P 9/04 |
| 10,097,124 B2 * | 10/2018 | Chassard | | G05F 1/00 |
| 2003/0042874 A1 * | 3/2003 | Anderson | | H02J 7/166 322/28 |
| 2003/0117144 A1 * | 6/2003 | Sutton | | G01R 31/343 324/546 |
| 2004/0021437 A1 * | 2/2004 | Maslov | | B60L 8/00 318/400.01 |
| 2005/0184689 A1 * | 8/2005 | Maslov | | B60L 8/00 318/400.41 |
| 2008/0056690 A1 * | 3/2008 | Fujishiro | | B60L 15/025 388/820 |
| 2009/0072777 A1 * | 3/2009 | Seguchi | | H02P 8/12 318/718 |
| 2011/0050184 A1 * | 3/2011 | Said | | H02P 9/302 322/95 |
| 2012/0286744 A1 * | 11/2012 | Tunzini | | H02J 7/1461 322/24 |
| 2013/0241463 A1 * | 9/2013 | Bando | | H02P 9/007 318/810 |
| 2014/0015534 A1 * | 1/2014 | Katayama | | H02J 7/0077 324/430 |
| 2014/0210426 A1 * | 7/2014 | Terada | | H02P 9/08 322/59 |
| 2014/0257610 A1 * | 9/2014 | Kimoto | | B60L 53/55 701/22 |
| 2015/0365032 A1 * | 12/2015 | Katsumata | | H02P 21/141 318/802 |
| 2016/0103189 A1 * | 4/2016 | DeMarco | | G01R 31/343 324/764.01 |
| 2018/0041150 A1 * | 2/2018 | Graefling | | H02P 9/04 |
| 2018/0083560 A1 * | 3/2018 | Chassard | | G05F 1/00 |
| 2018/0340969 A1 * | 11/2018 | Mueller | | G01R 31/343 |
| 2019/0011488 A1 * | 1/2019 | Mueller | | B60L 3/12 |

* cited by examiner

METHOD FOR DETECTING A FAULT IN A GENERATOR UNIT

FIELD

The present invention relates to a method for detecting a fault in a generator unit, as well as to a processing unit, especially a generator regulator, and to a computer program for the implementation thereof.

BACKGROUND INFORMATION

Motor vehicles come equipped with an electrical system that is supplied with voltage by an electrical machine operated as a generator, for example, an externally excited synchronous motor. The vehicle system voltage can thereby be regulated by controlling an excitation current of the electrical machine. The electrical machine is generally connected via a rectifier to the vehicle electrical system and, together with the same, forms a generator unit. Faults, such as short circuits, for example, can occur in such generator units and should be detected whenever possible.

A method for detecting a fault in a generator unit is described in German Patent Application No. DE 10 2015 211 933. It discusses an electrical machine that includes a rotor winding and a stator winding and a rectifier connected thereto, via which the electrical machine is connected to an electrical system of a motor vehicle; a voltage of the electrical system being regulated to a setpoint value and a characteristic curve of the excitation current being monitored as a function of an excitation current traversing the rotor winding of the electrical machine; and a fault in the generator unit being inferred upon detection of an oscillating characteristic of the excitation current; a magnitude of the oscillation exceeding a threshold value.

SUMMARY

The present invention provides a method for detecting a fault in a generator unit and, to implement the same, a processing unit and a computer program. Advantageous embodiments are described herein.

A first aspect of the present invention may provide a method for detecting a fault in a generator unit having the features of independent claim 1. It may be provided here that the determination as to whether or not the fault exists be made not only as a function of the excitation current, but also as a function of a setpoint value of the excitation current. This has the advantage of making it possible for faults to be detected very reliably.

The method is readily realized when the setpoint value of the excitation current is ascertained as a function of a setpoint value of the generator voltage. The setpoint value of the excitation current is already present in this case due to the structure of the controller.

A very simple design of the controller is provided when the setpoint value of the excitation current is also ascertained as a function of an actual value of the generator voltage.

Another aspect may provide that a switch be controlled to switch the excitation current as a function of the setpoint value of the excitation current. Especially suited for the control is a PWM signal, in response to which namely the duty factor and/or the frequency are/is adjusted during the control.

A very simple design of the controller is provided by providing it as a cascaded controller where the control is also effected as a function of the actual value of the excitation current.

Another aspect of the present invention may provide that the existence of the fault be determined as a function of a deviation between the setpoint value of the excitation current and the actual value of the excitation current. Such a method is very readily parameterized.

It may be provided here that the existence of the fault be determined when, especially only when an absolute value of the deviation is greater than a predefinable threshold value.

Another aspect may provide a method for securely operating a generator unit. If the existence of the fault in the generator unit is recognized, the amount of excitation current is reduced, or the excitation current is pulsed. The pulsing signifies a reduction in a pulse frequency of the switch. (See FIG. 12, step 1280).

A processing unit according to the present invention, especially a generator regulator, for example, a control unit of a motor vehicle, is adapted, especially in terms of software engineering, for implementing a method according to the present invention. However, the processing unit may be wholly or completely adapted in terms of hardware for implementing the method.

Implementing the method as a computer program (see FIG. 13) is also advantageous since it entails especially low costs, particularly when a control unit to be realized is also used for other tasks and is, therefore, already present.

Other advantages and embodiments of the present invention are described herein and are shown in the figures.

The present invention is schematically illustrated in the figures with reference to an exemplary embodiment and is described in the following with reference to the figures.

DETAILED DESCRIPTION OF EXAMPLE EMBODIMENTS

Figure 1:
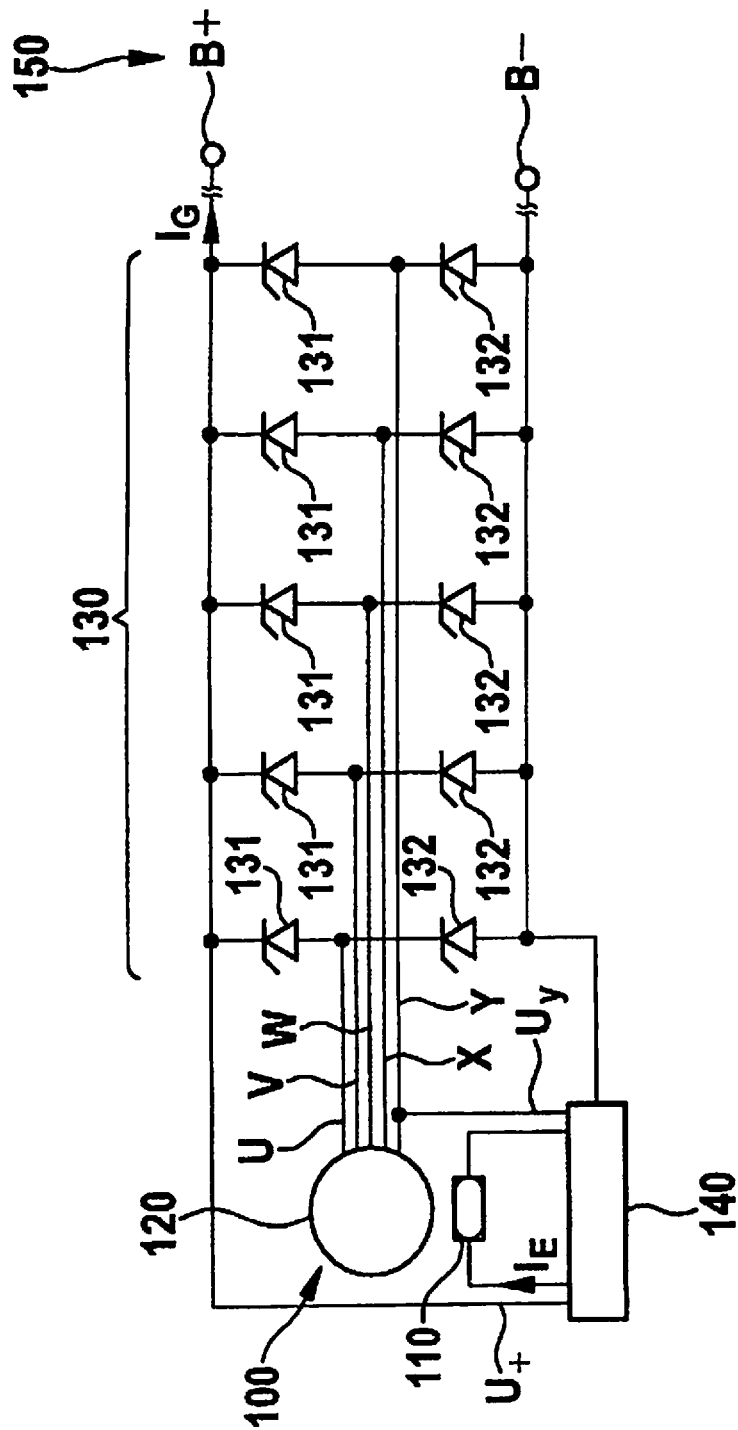
FIG. 1 schematically shows a generator unit having an electrical machine, a rectifier and generator regulator for implementing a method according to the present invention.

FIG. 1 schematically shows a generator unit having an electrical machine 100 including a rectifier 130 and a processing unit 140 configured as a generator regulator for implementing a method according to the present invention. Electrical machine 100 has a rotor winding or excitation winding 110 and a stator winding 120 and, in the present case, is used as a voltage supply generator for an electrical system 150 of a motor vehicle.

Electrical machine 100 and thus stator winding 120 thereof are designed here to have five phases U, V, W, X and Z. Each of the five phases is thereby connected via an associated diode 131 of rectifier 130 to a positive side or a high side B+ of electrical system 150 and via an associated diode 132 to a negative side or a low side B− of electrical system 150. It is understood that the number five of the phases is merely selected exemplarily and that a method according to the present invention may also be implemented with a different number of phases, for example, 3, 6, 7 or more. It is likewise possible to use suitable semiconductor switches instead of the diodes.

Generator regulator 140 supplies rotor winding 110 with an excitation current $I_E$. To this end, a switch that is connected in series to rotor winding 110 and that adjusts excitation current $I_E$, for example, by a pulsed control, may be provided in generator regulator 140. Furthermore, generator regulator 140 features inputs for sensing the vehicle system voltage at B+ and B−, as well as a phase voltage, here of phase Y, having voltage $U_Y$. A current supplied by electrical machine 100 is denoted here by $I_G$.

FIG. 2 through 5 each show the configuration of FIG. 1, in each instance having a specific fault in rectifier 130.

Figure 2:
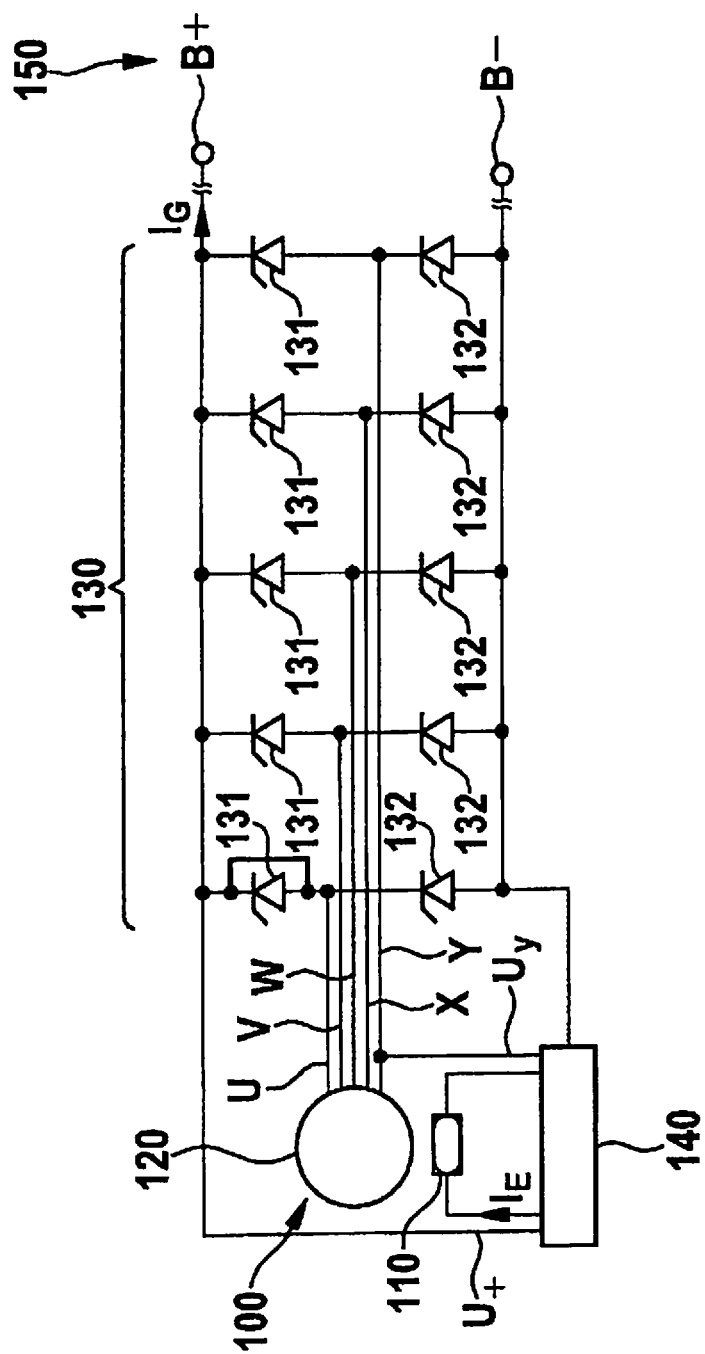
FIG. 2 through 5 show the generator unit from FIG. 1 having various faults in the rectifier.

FIG. 2 exemplarily shows a short circuit in the high-side circuit, in the present case in phase U. This may occur, for example, during a short circuit of associated diode 131.

Figure 3:
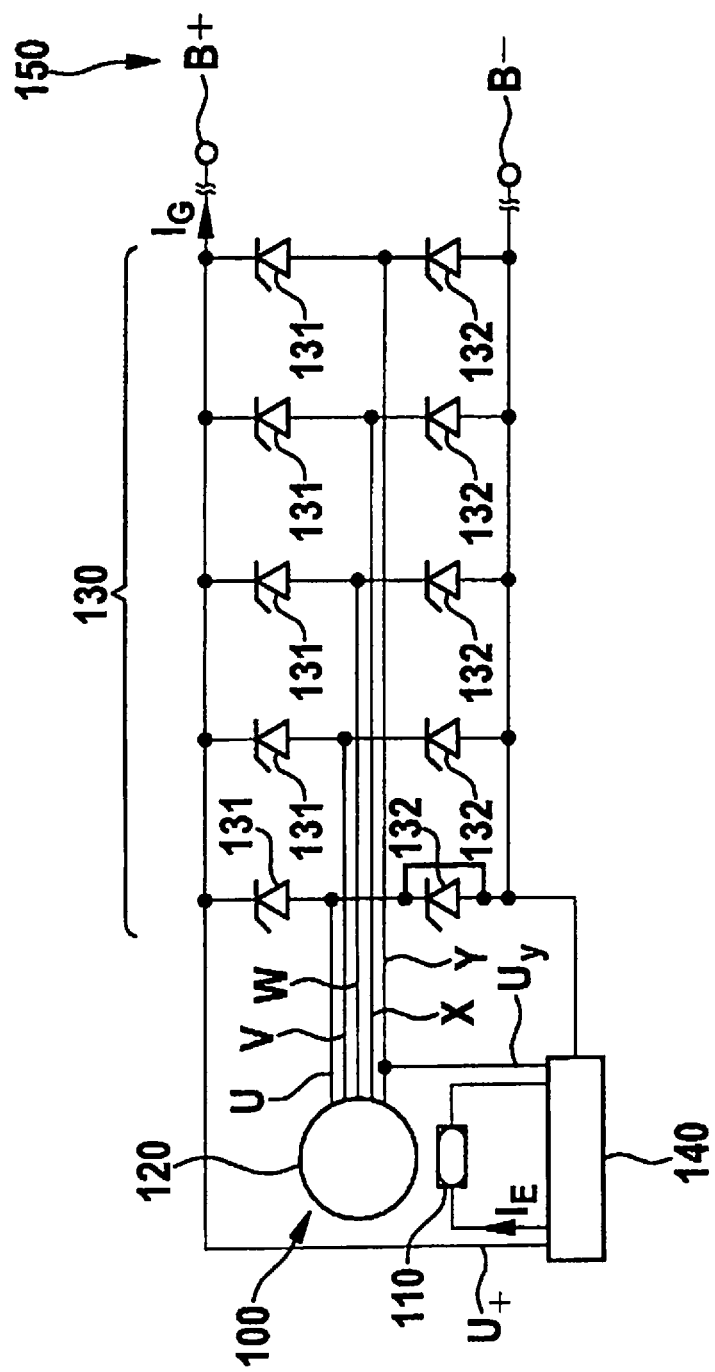

FIG. 3 exemplarily shows a short circuit in the low-side circuit, in the present case in phase U. This may occur, for example, during a short circuit of associated diode 132.

Figure 4:
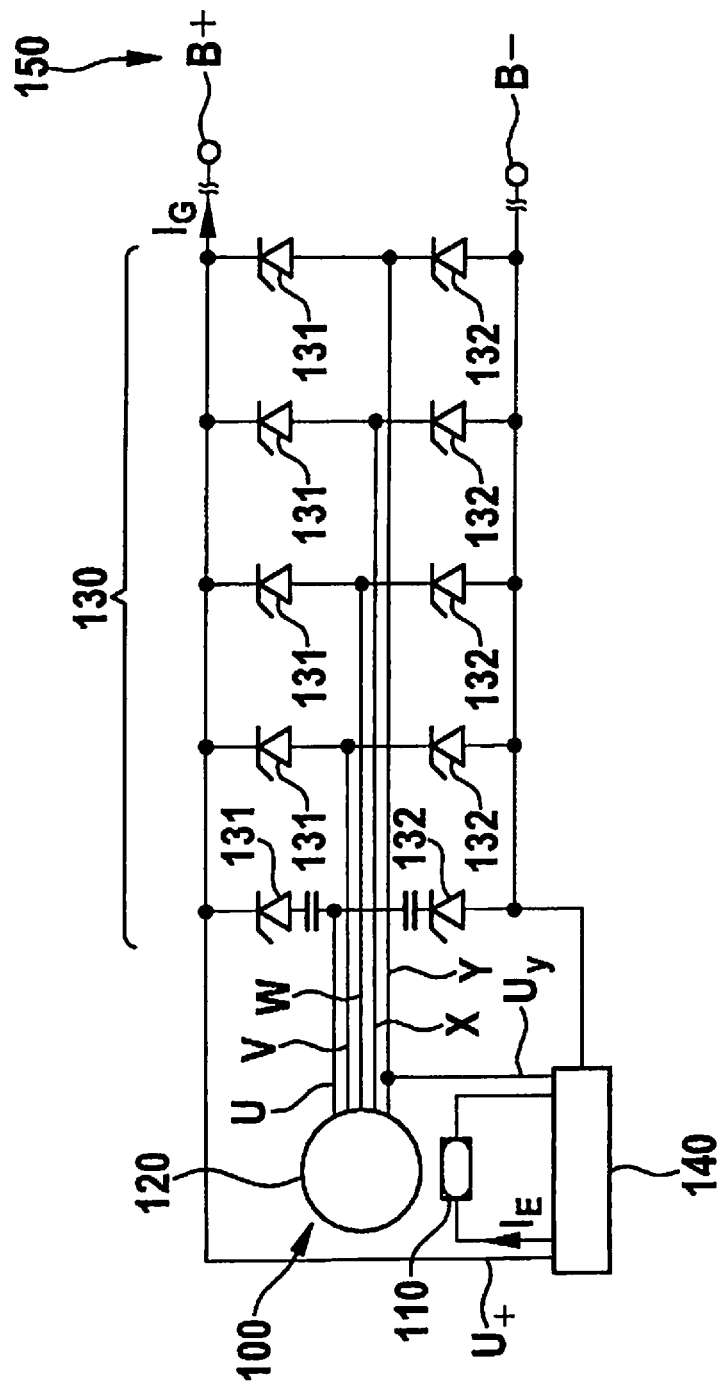

FIG. 4 exemplarily shows an isolated phase, in the present case, phase U. This may occur, for example, in the case of a disconnection or destruction (non-conductive state) of the two associated diodes 131 and 132. However, this fault occurs just as well in the case of a disconnection of the corresponding line to stator winding 120 which is connected to both diodes.

Figure 5:
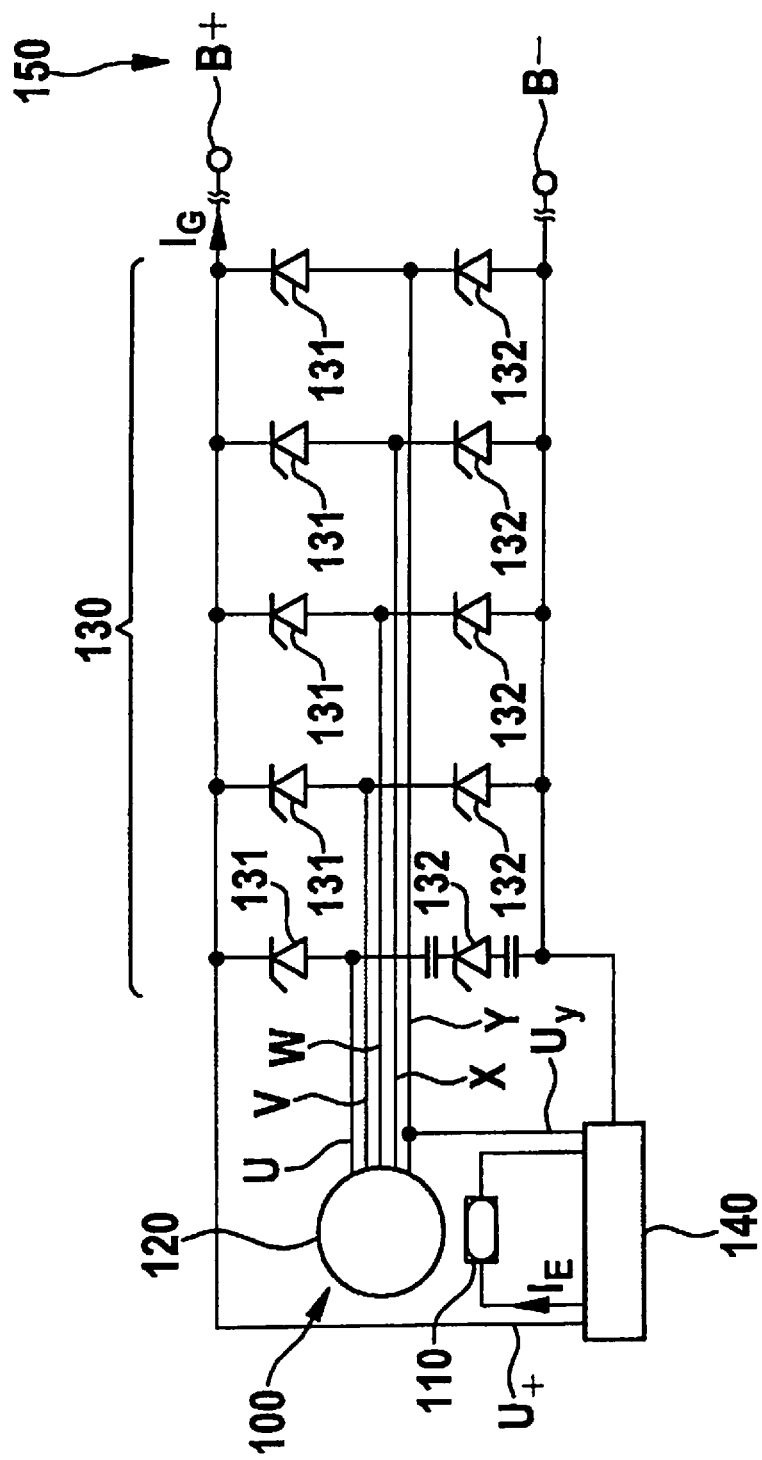

FIG. 5 shows exemplarily a break in a low-side circuit, in the present case in phase U. Such a break occurs, for example, when respective diode 132 is disconnected on one side of the diode, or, as shown in the figure, on both sides thereof, or when the diode is destroyed, for example. Accordingly, a break in a high-side circuit would occur in the case of a disconnection or destruction of a diode 131, for example.

FIG. 6 through 9 each show curves of generator voltage U+, of generator current $I_G$, of phase voltage $U_y$ of phase Y (not in FIG. 7) and of excitation current $I_E$ over time t. Prior to point in time $t_0$, a normal operation of the configuration prevails and, at point in time $t_0$, a fault occurs in the generator unit. The curves in FIG. 6 through 9 correspond to the curves associated with the faults, as shown in FIG. 2 through 5. It should be noted in this regard that the scaling of the individual diagrams does not always match, both in the case of the current, respectively voltage, and time. However, this is not relevant to the present invention.

Figure 6:
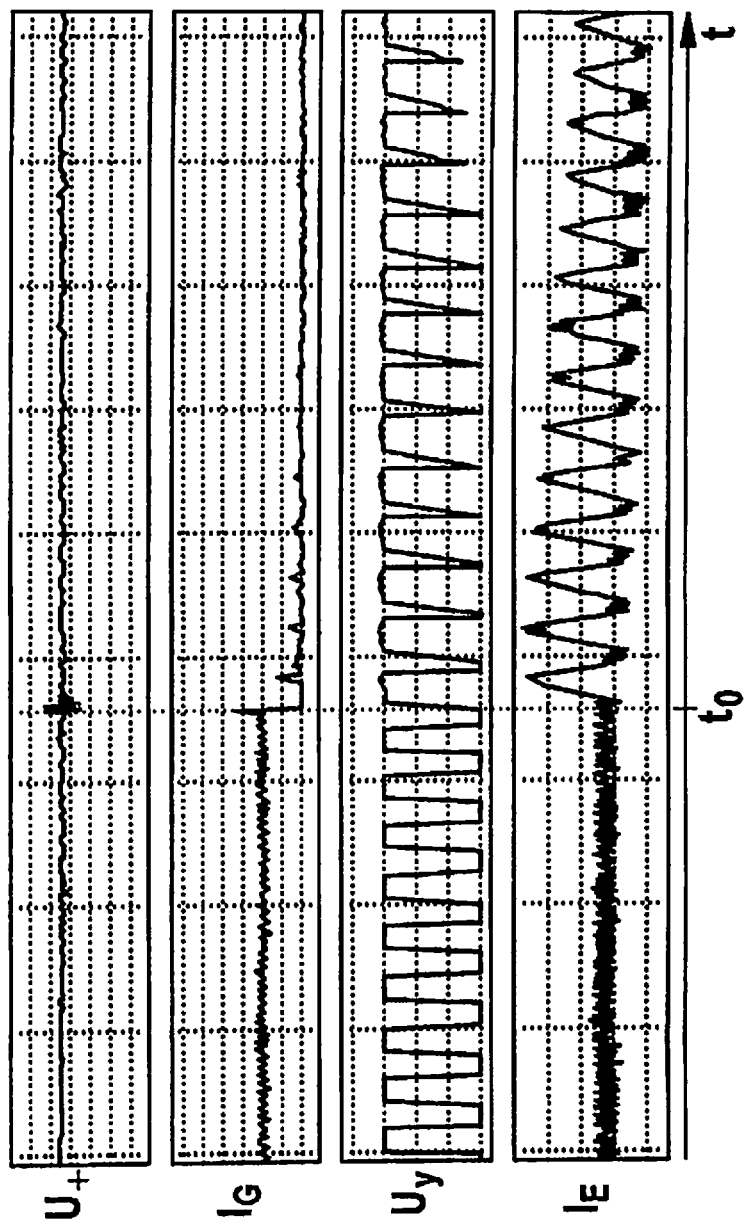
FIG. 6 through 9 show diagrams of voltage and current curves associated with the faults shown in FIG. 2 through 5.

In the case of the generator voltage, it is discernible in FIG. 6 that a short circuit in a high-side circuit becomes noticeable only a short time after the occurrence of the fault. The generator current decreases, and the phase voltage changes in terms of the vibration pattern thereof. In comparison to a curve without faults, a distinct, high-amplitude vibration is evident in the excitation current. Even though the fault would also be discernible here in the phase voltage, it is even more apparent in the curve of the excitation current. Frequency f of the vibration in 1/s corresponds here to $$f=n \cdot PPN/60,$$

n being the speed of the generator in 1/min and PPN the pole pair number of the generator.

This curve of the excitation current results from an asymmetrical distribution of the phase currents following the short circuit, which then contain a dc component. In response to the rotation of the electrical machine, these unequal dc components are then transferred to the rotor of the electrical machine, since the externally excited synchronous motor may be regarded as a transformer which, on the one hand, renders possible a feeding from the rotor to the stator, on the other hand, however, also a feeding back from the stator to the rotor. A significant ac component is thereby superimposed on the excitation current, making it possible to infer the short circuit.

Figure 7:
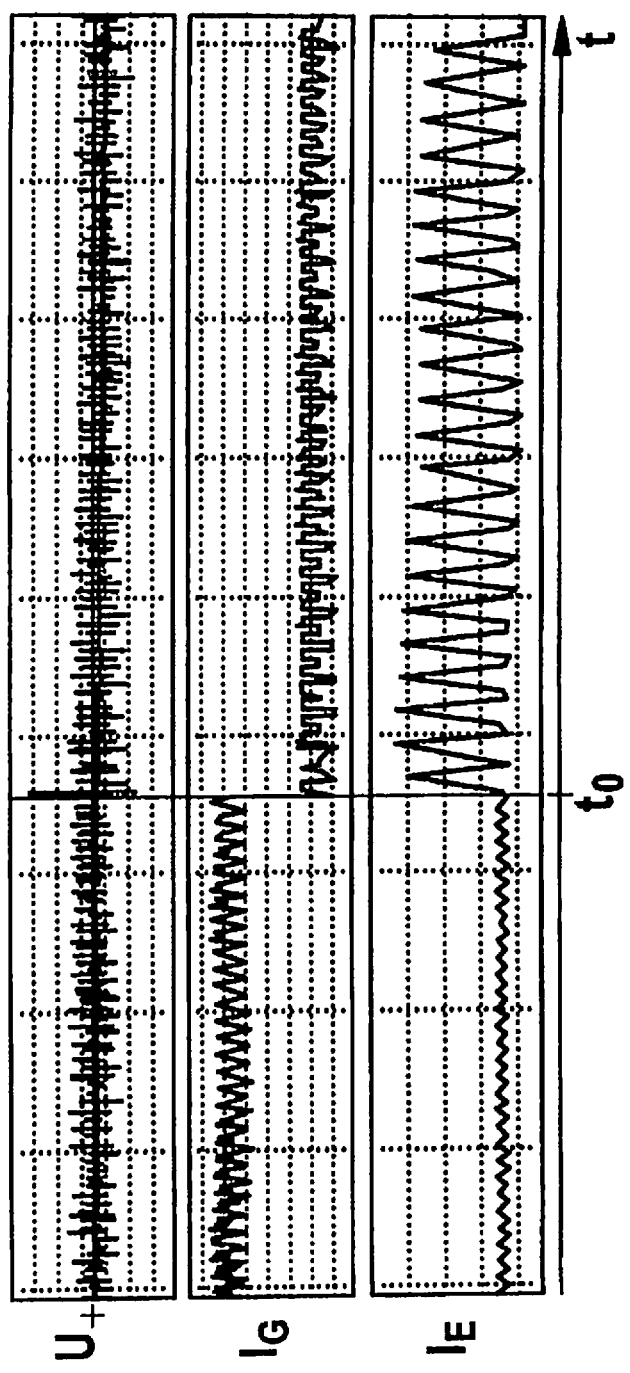

In the case of the generator voltage, it is discernible in FIG. 7 that a short circuit in a low-side circuit becomes noticeable only a short time after the fault occurs and the generator current decreases. In comparison to the curve without faults, a significant high-amplitude vibration is discernible in the excitation current, as is also typical of the high-side circuit, making it possible for the short circuit to be recognized.

Figure 8:
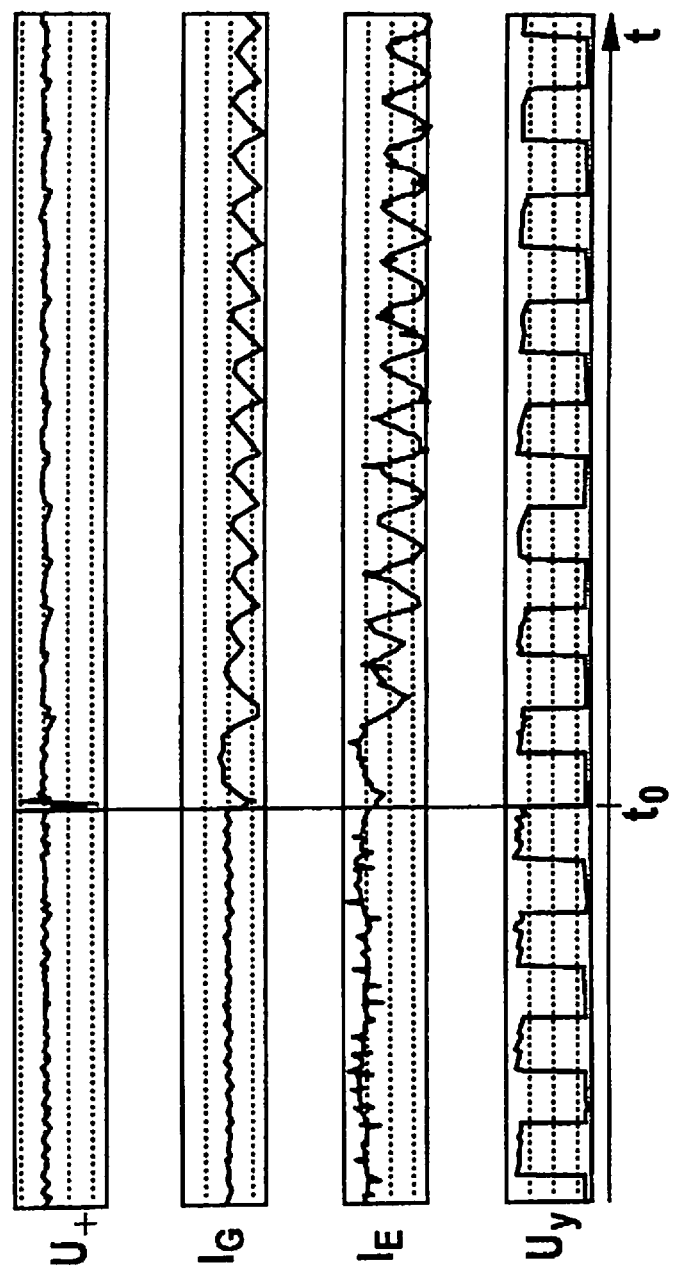

In the case of the generator voltage, it is discernible in FIG. 8 that a disconnection of an entire phase becomes noticeable shortly after the occurrence of the fault because of a larger fluctuation in the voltage and subsequently only becomes slightly noticeable because of minor fluctuations. The generator current turns into a vibration having an increased amplitude. The excitation current decreases slightly and turns into a vibration having a significantly higher amplitude than before the occurrence of the fault. The phase voltage across the disconnected phase is no longer limited by a rectification. Therefore, it exhibits the significantly higher open-circuit voltage of the electrical machine. The phase voltage does not change, however, across the phases that are not damaged (as shown exemplarily in the figure).

Thus, it is not possible for a disconnected phase to be recognized on the basis of the phase voltage, unless the defect relates to the only phase being monitored. On the other hand, a disconnection of a phase is clearly discernible from the excitation current. An asymmetric phase current distribution occurs here, in turn. In the case of short-circuits or breaks, an additional dc component is produced on the stator side that is transferred as an ac component to the rotor side. On the other hand, when a phase is disconnected, the phase current in the corresponding phase is reduced to zero. Accordingly, the remaining phases must compensate for this component and are thus asymmetrically loaded. In the case of a fault in the dropped phase, the frequency of the oscillation is twice as high as in the case of the previously mentioned fault cases, and thus may be uniquely distinguished therefrom.

Figure 9:
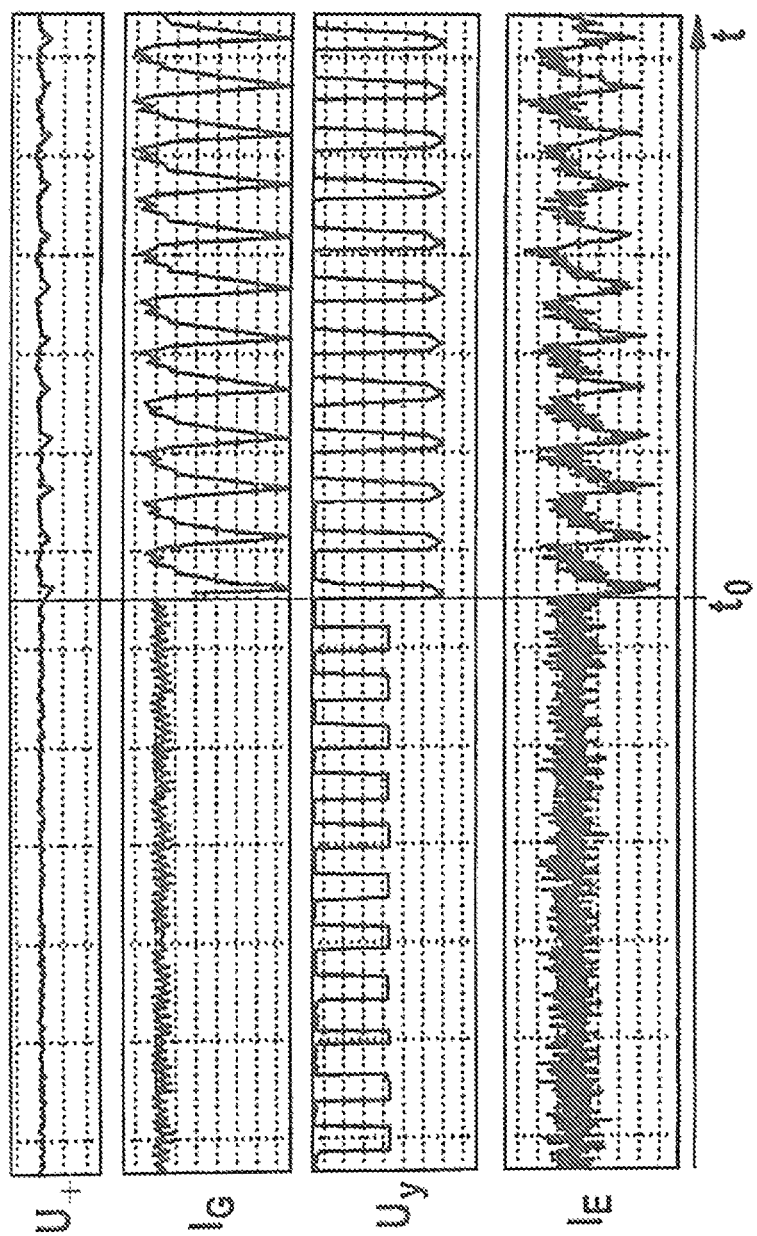

It is discernible in FIG. 9 that a break in a low-side circuit leads to slight fluctuations in the generator voltage. The generator current follows a vibration where the value of the current approaches zero in each case upon reaching the respective, disconnected low-side circuit. The phase voltage features a higher amplitude than before the fault, and the excitation current likewise features a vibration having a significantly increased amplitude.

Figure 10:
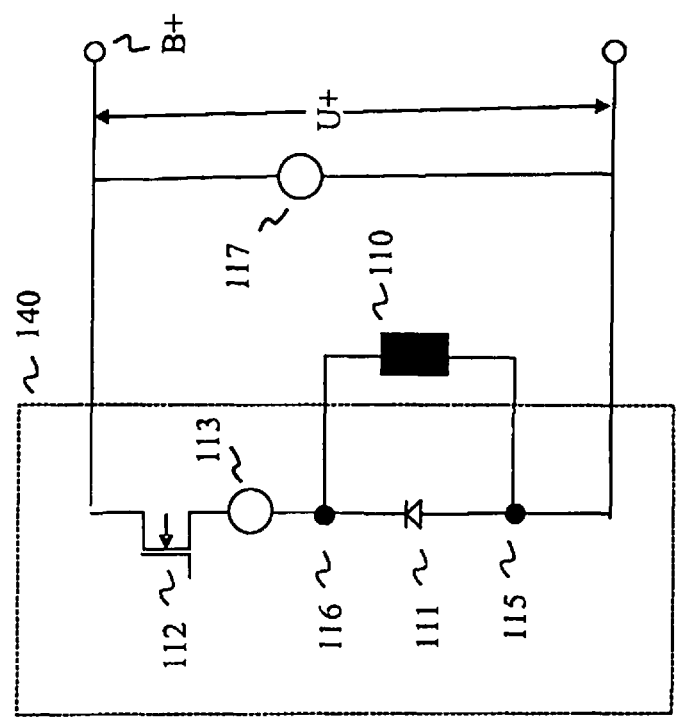
FIG. 10 schematically shows the design of the excitation circuit of the generator unit.

FIG. 10 shows a possible connection of the excitation circuit in greater detail. Shown here is processing unit 140, which is connected to positive side B+ and negative side B− of the vehicle electrical system and which energizes rotor winding 110. To this end, a switch 112, for example, a MOSFET is provided that is operated in a switched mode.

If switch 112 is closed, the current flows from positive side B+ to negative side B− via switch 112, a first junction 116, rotor winding 110 and a second junction 115.

If switch 112 is open, the current flows from rotor winding 110 back into the same via a free-wheeling diode 111 that is connected in parallel to rotor winding 110 between junctions 115 and 116.

FIG. 10 shows a first possible sensing of excitation current $I_E$ that flows over rotor winding 110. Connected in series to switch 112 between a terminal at positive side B+ and first junction 116 is a measuring device 113, for example, a voltage sensing via a measuring shunt.

Another option (not shown) for sensing the excitation current is to connect measuring device 113 in series to free-wheeling diode 111, between junctions 115 and 116, in parallel to rotor winding 110.

Another option (not shown) for sensing excitation current $I_E$ is for measuring device 113 to be connected in series to rotor winding 110, between junctions 115 and 116, in parallel to free-wheeling diode 113. Here the advantage is derived that excitation current $I_E$ may be ascertained in every circuit state of switch 112.

A voltmeter 117 may be provided to ascertain generator voltage U+.

Figure 11:
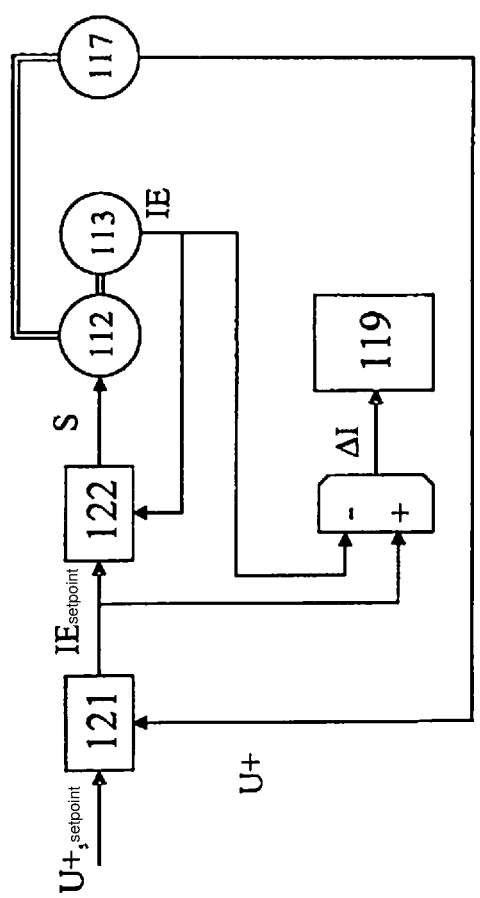
FIG. 11 schematically shows a possible control circuit for controlling the excitation current.

FIG. 11 schematically shows a possible control circuit for regulating the control of switch 112, and a possible detection of the faults illustrated in FIG. 2 through 5.

Figure 12:
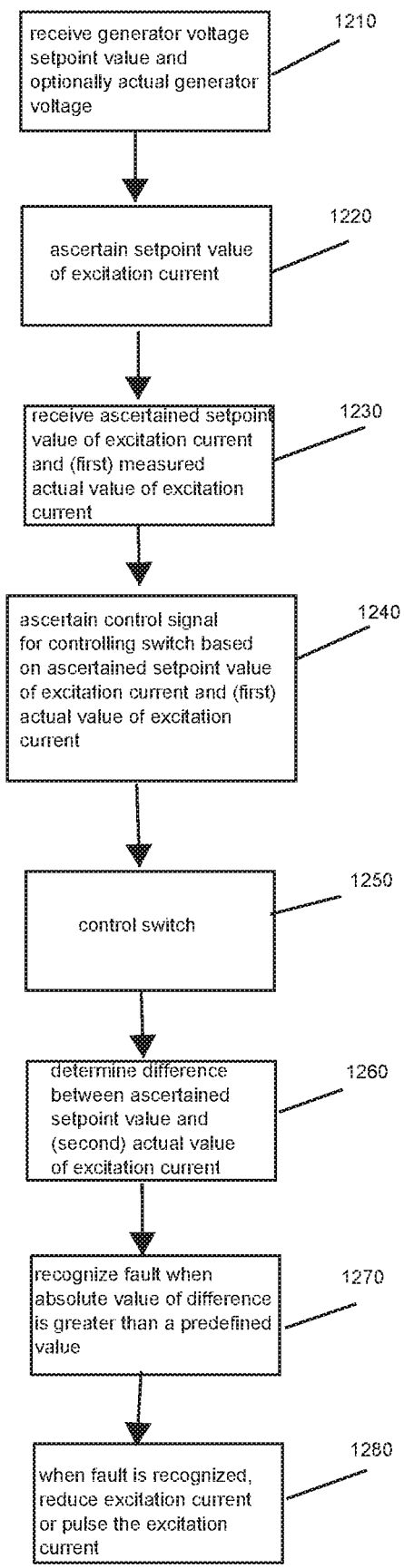
FIG. 12 shows a flow chart for controlling the switch and detecting faults.
Figure 13:
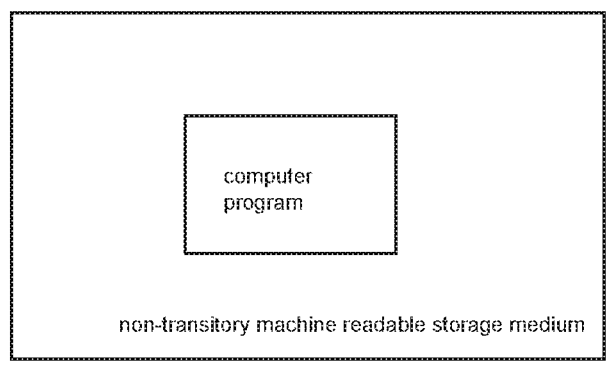
FIG. 13 schematically shows a computer program according to the present invention stored on a non-transitory machine readable storage medium.

A setpoint value $U+_{,setpoint}$ of generator voltage U+ is transmitted to a block 121 which is optionally supplied with the actual value of generator voltage U+ ascertained by voltmeter 117. (FIG. 12, step 1210). Via a characteristics map, for example, a setpoint value of excitation current $I_{Esetpoint}$ is ascertained from generator voltage setpoint value $U+_{,setpoint}$ and optionally from generator voltage U+. (FIG. 12, step 1220) This setpoint value $I_{Esetpoint}$ is transmitted to a block 122 to which is likewise transmitted the actual value of excitation current $I_E$ ascertained by measuring device 113. (FIG. 12, step 1230) From setpoint value $I_{Esetpoint}$ and actual value $I_E$ of the excitation current, block 122 ascertains a control signal S for controlling switch 112. (FIG. 12, step 1240).

Controlling switch 112 and the operative connections in the generator unit has an effect on actual value $I_E$ of the excitation current and on generator voltage U+ that are ascertained by sensors 113, 117. The control circuit thereby closes. (FIG. 12, step 1250).

Setpoint value $I_{Esetpoint}$ and actual value $I_E$ of the excitation current may be fed to a differential block that ascertains a deviation $$\Delta I = I_{Esetpoint} - I_E$$

therefrom. (FIG. 12, step 1260). This deviation $\Delta I$ is fed to a block 119 that, as a function thereof, determines whether one of the faults illustrated in FIG. 2 through 5 exists.

It may be provided, for example, for faults to be determined when an absolute value of deviation $\Delta I$ is greater than a predefinable threshold value. (FIG. 12, step 1270).

What is claimed is:

1. A method for detecting a fault in a generator unit, the generator unit including an electrical machine, and a rotor winding, a stator winding, and a rectifier connected to the electrical machine, via which the electrical machine is connected to an electrical system of a motor vehicle, the method comprising:
    ascertaining an excitation current traversing the rotor of the electrical machine;
    determining a difference between the ascertained excitation current and a determined setpoint value of the excitation current;
    comparing the determined difference to a predetermined threshold value;
    determining a fault exists in the generator unit when an absolute value of the determined difference is greater than the predetermined threshold value;
    wherein the stator winding includes a plurality of phases, each of the phases being connected to a positive side of the electrical system by a respective high-side circuit, and each of the phases being connected to a negative side of the electrical system by a respective low-side circuit, and wherein the determined fault is: (i) a short circuit in one of the respective high-side circuits, or (ii) a short circuit in one of the respective low-side circuit, or (iii) a break in one of the respective low-side circuits, or (iv) a disconnection of one of the plurality of the phases.

2. The method as recited in claim 1, wherein the determined setpoint value of the excitation current is determined from a setpoint value of a voltage of the generator using a characteristics map.

3. The method as recited in claim 2, wherein the determined setpoint value of the excitation current is also determined from an actual value of the voltage of the generator using the characteristics map.

4. The method as recited in claim 3, further comprising:
    ascertaining a control signal from the determined setpoint value of the excitation current; and
    controlling a switch to switch the excitation current using the control signal.

5. The method as recited in claim 4, wherein the control signal is also ascertained from another actual value of the excitation current.

6. The method as recited in claim 1, wherein the generator unit includes a generator regulator connected to the positive side of the electrical system and connected to the negative side of the electrical system, the generator regulator configured to energize the rotor winding and including a switch connected in series with a measuring device and a free-wheeling diode, the free-wheeling diode connected in parallel to the rotor winding, and wherein the method further comprising:
    prior to the ascertaining of the actual excitation current, closing the switch; and
    wherein the ascertaining of the actual excitation current traversing the rotor of the electrical machine includes ascertaining the actual excitation current traversing the rotor of the electrical machine using the measuring device while the switch is closed.

7. A method for securely operating a generator unit, the generator unit including an electrical machine, and a rotor winding, a stator winding, and a rectifier connected to the electrical machine, via which the electrical machine is connected to an electrical system of a motor vehicle, the method comprising:
    ascertaining an excitation current traversing the rotor of the electrical machine;
    determining a difference between the ascertained excitation current and a determined setpoint value of the excitation current;
    comparing the determined difference to a predetermined threshold value;
    recognizing a fault exists in the generator unit when an absolute value of the determined difference is greater than the predefined threshold value; and
    based on recognizing the fault exists, one of: (i) reducing an amount of excitation current, or (ii) pulsing the excitation current;

wherein the stator winding includes a plurality of phases, each of the phases being connected to a positive side of the electrical system by a respective high-side circuit, and each of the phases being connected to a negative side of the electrical system by a respective low-side circuit, and wherein the recognized fault is: (i) a short circuit in one of the respective high-side circuits, or (ii) a short circuit in one of the respective low-side circuit, or (iii) a break in one of the low-side circuits, or (iv) a disconnection of one of the plurality of the phases.

8. The method as recited in claim 7, wherein the generator unit includes a generator regulator connected to the positive side of the electrical system and connected to the negative side of the electrical system, the generator regulator configured to energize the rotor winding and including a switch connected in series with a measuring device and a free-wheeling diode, the free-wheeling diode connected in parallel to the rotor winding, and wherein the method further comprising:
   prior to the ascertaining of the actual excitation current, closing the switch; and
   wherein the ascertaining of the actual excitation current traversing the rotor of the electrical machine includes ascertaining the actual excitation current traversing the rotor of the electrical machine using the measuring device while the switch is closed.

9. A generator regulator that is adapted for securely operating a generator unit, the generator unit including an electrical machine, and a rotor winding, a stator winding, and a rectifier connected to the electrical machine, via which the electrical machine is connected to an electrical system of a motor vehicle, the generator regulator adapted to:
   ascertain an excitation current traversing the rotor of the electrical machine;
   determine a difference between the ascertained excitation current and a determined setpoint value of the excitation current;
   compare the determined difference to a predetermined threshold value;
   recognize a fault exists in the generator unit when an absolute value of the determined difference is greater than the predefined threshold value; and
   based on recognizing the fault exists, one of: (i) reduce an amount of excitation current, or (ii) pulse the excitation current;
   wherein the stator winding includes a plurality of phases, each of the phases being connected to a positive side of the electrical system by a respective high-side circuit, and each of the phases being connected to a negative side of the electrical system by a respective low-side circuit, and wherein the recognized fault is: (i) a short circuit in one of the respective high-side circuits, or (ii) a short circuit in one of the respective low-side circuit, or (iii) a break in one of the respective low-side circuits, or (iv) a disconnection of one of the plurality of the phases.

10. The generator regulator as recited in claim 9, wherein the generator regulator is connected to the positive side of the electrical system and connected to the negative side of the electrical system, the generator regulator is configured to energize the rotor winding and includes a switch connected in series with a measuring device and a free-wheeling diode, the free-wheeling diode connected in parallel to the rotor winding, and wherein the generator regulator is further configured to:
   prior to the ascertainment of the actual excitation current, close the switch; and
   wherein the ascertainment of the actual excitation current traversing the rotor of the electrical machine includes ascertaining the actual excitation current traversing the rotor of the electrical machine using the measuring device while the switch is closed.

11. A non-transitory machine-readable storage medium on which is stored a computer program for securely operating a generator unit, the generator unit including an electrical machine, and a rotor winding, a stator winding, and a rectifier connected to the electrical machine, via which the electrical machine is connected to an electrical system of a motor vehicle, the computer program, when executed by a computer, causing the computer to perform:
   ascertaining an excitation current traversing the rotor of the electrical machine;
   determining a difference between the ascertained excitation current and a determined setpoint value of the excitation current;
   comparing the determined difference to a predetermined threshold value;
   recognizing a fault exists in the generator unit when an absolute value of the determined difference is greater than the predefined threshold value; and
   based on recognizing the fault exists, one of: (i) reducing an amount of excitation current, or (ii) pulsing the excitation current;
   wherein the stator winding includes a plurality of phases, each of the phases being connected to a positive side of the electrical system by a respective high-side circuit, and each of the phases being connected to a negative side of the electrical system by a respective low-side circuit, and wherein the recognized fault is: (i) a short circuit in one of the respective high-side circuits, or (ii) a short circuit in one of the respective low-side circuit, or (iii) a break in one of the respective low-side circuits, or (iv) a disconnection of one of the plurality of the phases.

* * * * *